(12) United States Patent
Koller et al.

(10) Patent No.: US 12,744,516 B2
(45) Date of Patent: Sep. 22, 2026

(54) SYSTEMS AND METHODS FOR IMPEDANCE TUNING

(71) Applicant: Apple Inc., Cupertino, CA (US)

(72) Inventors: Josef W Koller, Burglengenfeld (DE); Bjoern Lenhart, Nuremberg (DE); Dominic Koehler, Viereth-Trunstadt (DE); Rastislav Vazny, Sunnyvale, CA (US); Joonhoi Hur, Sunnyvale, CA (US); Harald Pretl, Schwertberg (AT)

(73) Assignee: Apple Inc., Cupertino, CA (US)

( * ) Notice: Subject to any disclaimer, the term of this patent is extended or adjusted under 35 U.S.C. 154(b) by 521 days.

(21) Appl. No.: 17/946,629

(22) Filed: Sep. 16, 2022

(65) Prior Publication Data

US 2024/0097657 A1 Mar. 21, 2024

(51) Int. Cl.
*H03J 3/20* (2006.01)
*H04B 1/18* (2006.01)

(52) U.S. Cl.
CPC .................. *H03J 3/20* (2013.01); *H04B 1/18* (2013.01); *H03J 2200/06* (2013.01)

(58) Field of Classification Search
CPC .......... H03J 3/20; H03J 2200/06; H04B 1/18; H04B 1/0458; H04B 1/525
See application file for complete search history.

(56) References Cited

U.S. PATENT DOCUMENTS 5,442,812 A * 8/1995 Ishizaki .................... H01P 1/15 455/83
5,777,475 A * 7/1998 Vester ................ G01R 33/3628 324/322
6,496,708 B1 * 12/2002 Chan ...................... H04B 1/406 455/553.1

(Continued)

FOREIGN PATENT DOCUMENTS

CN 110661543 A * 1/2020
CN 112615598 A * 4/2021 ............... H03H 7/46

(Continued)

*Primary Examiner* — Yuwen Pan
*Assistant Examiner* — Swati Jain
(74) *Attorney, Agent, or Firm* — FLETCHER YODER PC

(57) ABSTRACT

In electronic devices used in radio-frequency communications, impedance matching may result in desirable operating conditions. However, impedance of the antenna may change over time (e.g., due to frequency of signals being transmitted or received, due to ambient conditions, due to age of antenna or related components). Accordingly, it may be desirable to employ antenna tracking circuitry that may operate as an impedance matching network to dynamically match the antenna impedance. To dynamically match the antenna impedance, the matching network may include tunable components. To provide fast, dynamic, and effective impedance matching, antenna tracking circuitry having an architecture with analytically determinable impedance (e.g., determinable via one or more equations) may be implemented. The antenna tracking circuitry may include a variable resistor and three variable impedances. The three vari- (Continued)

able impedances may include components capable of tuning capacitor ranges of the three variable impedances, among other characteristics of the antenna tracking circuitry.

20 Claims, 8 Drawing Sheets

(56) References Cited

U.S. PATENT DOCUMENTS 6,721,544 B1 * 4/2004 Franca-Neto ............ H04B 1/52 455/340
7,671,693 B2 * 3/2010 Brobston ................. H03H 7/40 333/32
8,947,113 B2 * 2/2015 Han ....................... G01R 1/045 324/750.02
8,958,761 B2 * 2/2015 Visser ...................... H03H 7/40 455/115.1
9,306,533 B1 * 4/2016 Mavretic ........... H01J 37/32183
9,812,580 B1 * 11/2017 Goktepeli ............ H10D 86/215
10,141,971 B1 * 11/2018 Elkholy ............... H04B 7/2615
10,448,328 B2 * 10/2019 Sarkas ............... G01R 29/0878
10,790,796 B2 * 9/2020 Burgener ............. H03H 9/6403
2004/0157575 A1 * 8/2004 Kim ..................... H03G 1/0058 455/249.1
2005/0219010 A1 * 10/2005 Erb ...................... H04B 1/0053 333/126
2008/0136728 A1 * 6/2008 Banba ...................... H03H 7/38 29/601
2013/0241669 A1 * 9/2013 Mikhemar ............. H04B 1/581 333/126
2013/0241670 A1 * 9/2013 Mikhemar ............... H04B 1/18 333/126
2014/0210684 A1 * 7/2014 Hara ...................... H03H 9/706 343/858
2016/0074091 A1 * 3/2016 Amoah .............. A61B 18/1206 606/34
2017/0279436 A1 * 9/2017 Domino ................. H03H 11/28
2018/0138929 A1 * 5/2018 Ellä ...................... H04B 1/0057
2018/0159222 A1 * 6/2018 Backes .................... H03H 7/40
2023/0142184 A1 * 5/2023 Burgener ............... H03H 9/706 333/32
2025/0055500 A1 * 2/2025 Bagga ................. G01S 13/0209

FOREIGN PATENT DOCUMENTS

EP 0871288 A2 * 10/1998
EP 1583254 A1 * 10/2005 ........... H04B 1/0053
WO WO-02084782 A2 * 10/2002 ................ H01P 1/20

* cited by examiner

SYSTEMS AND METHODS FOR IMPEDANCE TUNING

BACKGROUND

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure.

In electronic devices used in radio-frequency (RF) communications, matching an impedance of a transceiver chain (e.g., including a receiver and transmitter) to an impedance of an antenna may result in desirable operating conditions (e.g., reduced insertion loss, increased isolation between the receiver and the transmitter, and so on). However, impedance of the antenna may change over time (e.g., due to frequency of signals being transmitted or received, due to ambient conditions, due to age of antenna or related components, due to user interaction, and so on).

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, an electronic device includes multiple antennas, a transmitter, a receiver, and duplexing circuitry coupled to the transmitter, the receiver, and the multiple antennas. The duplexing circuitry may include a resistance device coupled in parallel to a first impedance device, a second impedance device coupled to the first impedance device, and a third impedance device coupled to the first impedance device, the second impedance device, and the resistance device. The first impedance device, the second impedance device, the third impedance device, and the resistance device may be configurable to match an impedance associated with the multiple antennas.

In another embodiment, a method may include receiving a first frequency corresponding to a transmit signal transmitted by an antenna of an electronic device; receiving a second frequency corresponding to a received signal received by the antenna of the electronic device; receiving an impedance associated with the antenna from impedance measurement circuitry; and adjusting a set of variable capacitance devices, a variable resistance device, or both, based on the first frequency, the second frequency, and the impedance.

In yet another embodiment, a system may include a duplexer. The duplexer may include a resistance device and multiple impedance devices. The system may include tuning circuitry that may determine tuning states of the resistance device and the multiple impedance devices and cause the duplexer to adjust the resistance device and at least a portion of the plurality of impedance devices.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings described below in which like numerals refer to like parts.

DETAILED DESCRIPTION OF SPECIFIC EMBODIMENTS

Figure 1:
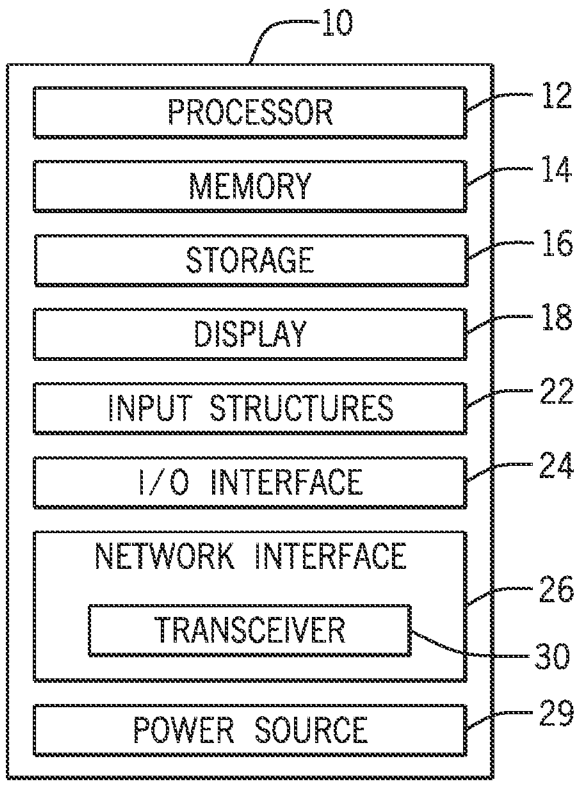
FIG. 1 is a block diagram of an electronic device, according to embodiments of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the particular features, structures, or characteristics may be combined in any suitable manner in one or more embodiments. Use of the terms "approximately," "near," "about," "close to," and/or "substantially" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on). Moreover, it should be understood that any exact values, numbers, measurements, and so on, provided herein, are contemplated to include approximations (e.g., within a margin of suitable or contemplatable error) of the exact values, numbers, measurements, and so on.

This disclosure is directed to isolating wireless signals between a transmitter and a receiver in a wireless communication device using a duplexer (e.g., an electrical balanced duplexer (EBD), a phase balanced duplexer (PBD), Wheatstone balanced duplexer (WBD), a double balanced duplexer (DBD), a circular balanced duplexer (CBD), or any other duplexer used to isolate wireless signals between transmitters and receivers). A tunable duplexer includes components that may be adjusted or tuned (e.g., phase shifters and/or impedance tuners) to alter isolation performance and insertion loss (e.g., loss resulting from the components of the duplexer providing less than ideal isolation of the transmission and/or received signals) between the transmitter, the receiver, and/or one or more antennas coupled to the transmitter and the receiver.

In electronic devices used in radio-frequency communications, matching an impedance of a transceiver chain (e.g., including the receiver and the transmitter) to an impedance of an antenna may result in desirable operating conditions (e.g., reduced insertion loss, increased isolation between the receiver and the transmitter, and so on). However, impedance of the antenna may change over time (e.g., due to frequency of signals being transmitted or received, due to ambient conditions, due to age of antenna or related components, due to user interaction, and so on). Accordingly, it may be desirable to employ antenna tracking circuitry that may operate as an impedance matching network to dynamically match the antenna impedance.

To dynamically match the antenna impedance, the matching network may include tunable components (e.g., variable resistors, variable capacitors, and so on). In some cases, the matching network may include and use a black box search algorithm or a machine learning algorithm to determine values of the tunable components to match the antenna impedance. However, the black box search algorithm and the machine learning algorithms may consume excessive time and/or processing power to provide sufficient impedance matching.

To provide fast, dynamic, and effective impedance matching, a matching network (e.g., antenna tracking circuitry) having an architecture with analytically determinable impedance (e.g., determinable via one or more equations) may be implemented in the transceiver chain of the electronic device (e.g., in a duplexer in the transceiver chain). The matching network may include a resistively loaded two-port network including a variable resistor and three variable impedance devices. The three variable impedance devices may include components capable of tuning capacitor ranges of the three variable impedance devices, among other characteristics of the antenna tracking circuitry. It should be understood that, although three variable impedance devices are disclosed in the embodiments herein, any suitable number of impedance devices is contemplated (e.g., one or more, two or more, five or more, ten or more, and so on).

In some embodiments, one or more of the variable impedances may include a variable capacitor coupled in parallel with an inductor. In other embodiments, one or more of the variable impedances may include a first variable capacitor coupled in parallel with a series-coupled inductor and a second variable capacitor. To tune the values of the components in the antenna tracking circuitry to match the impedance of the antenna, the antenna tracking circuitry may determine the impedance of the antenna, a transmit frequency corresponding to a transmitted signal and a receive frequency corresponding to a received signal. Based on the antenna impedance, the transmit frequency, and the receive frequency, a first set of relationships (e.g., equations, functions, expressions, and so on) may be determined to solve for the resistance value of the variable resistor. A second set of equations may be derived from the first set of equations (e.g., based on the resistance value being constant with respect to frequency and having no imaginary component). Solving the second set of equations provides capacitance values for the variable capacitors included in the variable impedances. Populating the variables included in the first set of equations with the capacitance values, the resistance value may be determined. Applying the capacitance value and the resistance value to the variable impedances and the variable resistor, respectively, may tune the matching network to match the impedance of the antenna.

With the foregoing in mind, FIG. 1 is a block diagram of an electronic device 10, according to embodiments of the present disclosure. The electronic device 10 may include, among other things, one or more processors 12 (collectively referred to herein as a single processor for convenience, which may be implemented in any suitable form of processing circuitry), memory 14, nonvolatile storage 16, a display 18, input structures 22, an input/output (I/O) interface 24, a network interface 26, and a power source 29. The various functional blocks shown in FIG. 1 may include hardware elements (including circuitry), software elements (including machine-executable instructions) or a combination of both hardware and software elements (which may be referred to as logic). The processor 12, memory 14, the nonvolatile storage 16, the display 18, the input structures 22, the input/output (I/O) interface 24, the network interface 26, and/or the power source 29 may each be communicatively coupled directly or indirectly (e.g., through or via another component, a communication bus, a network) to one another to transmit and/or receive signals between one another. It should be noted that FIG. 1 is merely one example of a particular implementation and is intended to illustrate the types of components that may be present in the electronic device 10.

By way of example, the electronic device 10 may include any suitable computing device, including a desktop or notebook computer (e.g., in the form of a MacBook®, MacBook® Pro, MacBook Air®, iMac®, Mac® mini, or Mac Pro® available from Apple Inc. of Cupertino, California), a portable electronic or handheld electronic device such as a wireless electronic device or smartphone (e.g., in the form of a model of an iPhone® available from Apple Inc. of Cupertino, California), a tablet (e.g., in the form of a model of an iPad® available from Apple Inc. of Cupertino, California), a wearable electronic device (e.g., in the form of an Apple Watch® by Apple Inc. of Cupertino, California), and other similar devices. It should be noted that the processor 12 and other related items in FIG. 1 may be embodied wholly or in part as software, hardware, or both. Furthermore, the processor 12 and other related items in FIG. 1 may be a single contained processing module or may be incorporated wholly or partially within any of the other elements within the electronic device 10. The processor 12 may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that may perform calculations or other manipulations of information. The processors 12 may include one or more application processors, one or more baseband processors, or both, and perform the various functions described herein.

In the electronic device 10 of FIG. 1, the processor 12 may be operably coupled with a memory 14 and a nonvolatile storage 16 to perform various algorithms. Such programs or instructions executed by the processor 12 may be stored in any suitable article of manufacture that includes one or more tangible, computer-readable media. The tangible, computer-readable media may include the memory 14 and/or the nonvolatile storage 16, individually or collectively, to store the instructions or routines. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor 12 to enable the electronic device 10 to provide various functionalities.

In certain embodiments, the display 18 may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more liquid crystal displays (LCDs), light-emitting diode (LED) displays, organic light-emitting diode (OLED) displays, active-matrix organic light-emitting diode (AMOLED) displays, or some combination of these and/or other display technologies.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 26. In some embodiments, the I/O interface 24 may include an I/O port for a hardwired connection for charging and/or content manipulation using a standard connector and protocol, such as the Lightning connector provided by Apple Inc. of Cupertino, California, a universal serial bus (USB), or other similar connector and protocol. The network interface 26 may include, for example, one or more interfaces for a personal area network (PAN), such as an ultra-wideband (UWB) or a BLUETOOTH® network, a local area network (LAN) or wireless local area network (WLAN), such as a network employing one of the IEEE 802.11x family of protocols (e.g., WI-FI®), and/or a wide area network (WAN), such as any standards related to the Third Generation Partnership Project (3GPP), including, for example, a 3$^{rd}$ generation (3G) cellular network, universal mobile telecommunication system (UMTS), 4$^{th}$ generation (4G) cellular network, long term evolution (LTE®) cellular network, long term evolution license assisted access (LTE-LAA) cellular network, 5$^{th}$ generation (5G) cellular network, and/or New Radio (NR) cellular network, a 6$^{th}$ generation (6G) or greater than 6G cellular network, a satellite network, a non-terrestrial network, and so on. In particular, the network interface 26 may include, for example, one or more interfaces for using a cellular communication standard of the 5G specifications that include the millimeter wave (mmWave) frequency range (e.g., 24.25-300 gigahertz (GHz)) that defines and/or enables frequency ranges used for wireless communication. The network interface 26 of the electronic device 10 may allow communication over the aforementioned networks (e.g., 5G, Wi-Fi, LTE-LAA, and so forth).

The network interface 26 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth.

As illustrated, the network interface 26 may include a transceiver 30. In some embodiments, all or portions of the transceiver 30 may be disposed within the processor 12. The transceiver 30 may support transmission and receipt of various wireless signals via one or more antennas, and thus may include a transmitter and a receiver. The power source 29 of the electronic device 10 may include any suitable source of power, such as a rechargeable lithium polymer (Li-poly) battery and/or an alternating current (AC) power converter.

Figure 2:
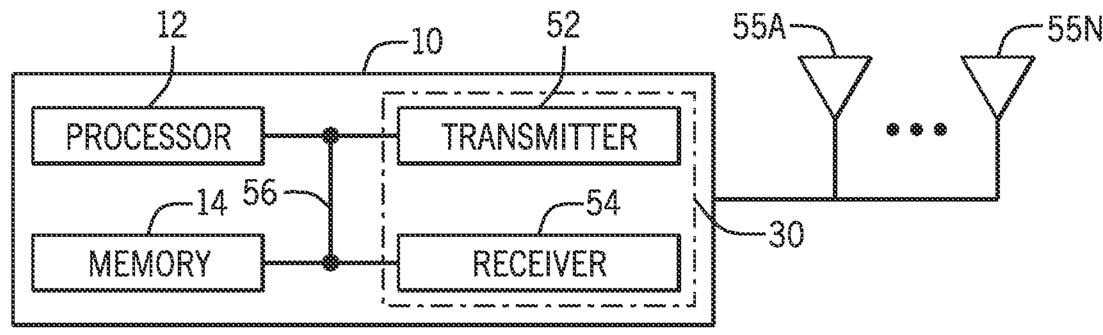
FIG. 2 is a schematic diagram of the electronic device of FIG. 1, according to embodiments of the present disclosure.

FIG. 2 is a functional diagram of the electronic device 10 of FIG. 1, according to embodiments of the present disclosure. As illustrated, the processor 12, the memory 14, the transceiver 30, a transmitter 52, a receiver 54, and/or antennas 55 (illustrated as 55A-55N, collectively referred to as an antenna 55) may be communicatively coupled directly or indirectly (e.g., through or via another component, a communication bus, a network) to one another to transmit and/or receive signals between one another.

The electronic device 10 may include the transmitter 52 and/or the receiver 54 that respectively enable transmission and reception of signals between the electronic device 10 and an external device via, for example, a network (e.g., including base stations or access points) or a direct connection. As illustrated, the transmitter 52 and the receiver 54 may be combined into the transceiver 30. The electronic device 10 may also have one or more antennas 55A-55N electrically coupled to the transceiver 30. The antennas 55A-55N may be configured in an omnidirectional or directional configuration, in a single-beam, dual-beam, or multi-beam arrangement, and so on. Each antenna 55 may be associated with a one or more beams and various configurations. In some embodiments, multiple antennas of the antennas 55A-55N of an antenna group or module may be communicatively coupled a respective transceiver 30 and each emit radio frequency signals that may constructively and/or destructively combine to form a beam. The electronic device 10 may include multiple transmitters, multiple receivers, multiple transceivers, and/or multiple antennas as suitable for various communication standards. In some embodiments, the transmitter 52 and the receiver 54 may transmit and receive information via other wired or wireline systems or means.

As illustrated, the various components of the electronic device 10 may be coupled together by a bus system 56. The bus system 56 may include a data bus, for example, as well as a power bus, a control signal bus, and a status signal bus, in addition to the data bus. The components of the electronic device 10 may be coupled together or accept or provide inputs to each other using some other mechanism.

Figures 3, 4:
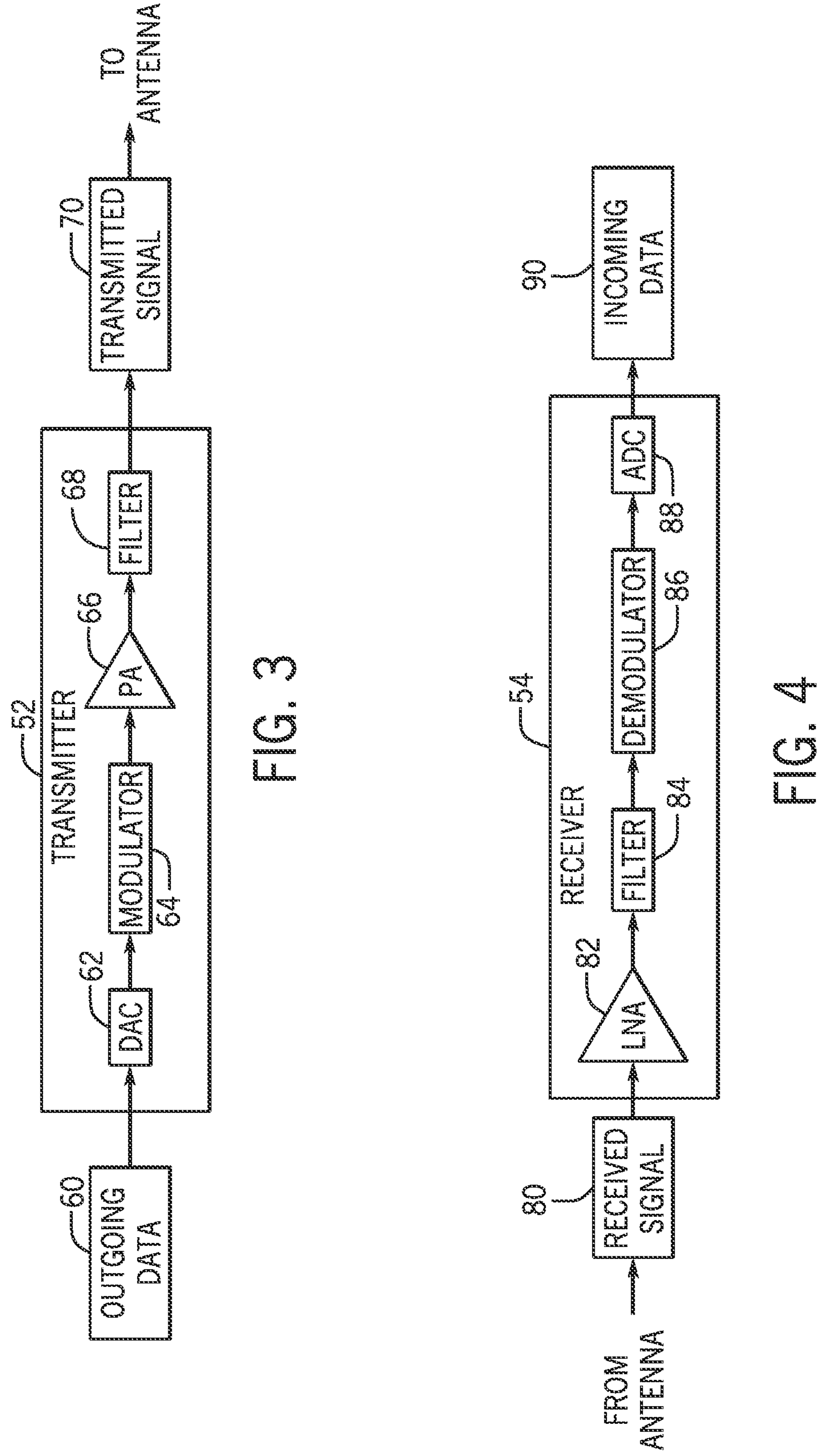
FIG. 3 is a schematic diagram of a transmitter of the electronic device of FIG. 1, according to embodiments of the present disclosure.
FIG. 4 is a schematic diagram of a receiver of the electronic device of FIG. 1, according to embodiments of the present disclosure.

FIG. 3 is a schematic diagram of the transmitter 52 (e.g., transmit circuitry), according to embodiments of the present disclosure. As illustrated, the transmitter 52 may receive outgoing data 60 in the form of a digital signal to be transmitted via the one or more antennas 55. A digital-to-analog converter (DAC) 62 of the transmitter 52 may convert the digital signal to an analog signal, and a modulator 64 may combine the converted analog signal with a carrier signal to generate a radio wave. A power amplifier (PA) 66 receives the modulated signal from the modulator 64. The power amplifier 66 may amplify the modulated signal to a suitable level to drive transmission of the signal via the one or more antennas 55. A filter 68 (e.g., filter circuitry and/or software) of the transmitter 52 may then remove undesirable noise from the amplified signal to generate transmitted signal 70 to be transmitted via the one or more antennas 55. The filter 68 may include any suitable filter or filters to remove the undesirable noise from the amplified signal, such as a bandpass filter, a bandstop filter, a low pass filter, a high pass filter, and/or a decimation filter.

The power amplifier 66 and/or the filter 68 may be referred to as part of a radio frequency front end (RFFE), and more specifically, a transmit front end (TXFE) of the electronic device 10. Additionally, the transmitter 52 may include any suitable additional components not shown, or may not include certain of the illustrated components, such that the transmitter 52 may transmit the outgoing data 60 via the one or more antennas 55. For example, the transmitter 52 may include a mixer and/or a digital up converter. As another example, the transmitter 52 may not include the filter 68 if the power amplifier 66 outputs the amplified signal in or approximately in a desired frequency range (such that filtering of the amplified signal may be unnecessary).

FIG. 4 is a schematic diagram of the receiver 54 (e.g., receive circuitry), according to embodiments of the present disclosure. As illustrated, the receiver 54 may receive received signal 80 from the one or more antennas 55 in the form of an analog signal. A low noise amplifier (LNA) 82 may amplify the received analog signal to a suitable level for the receiver 54 to process. A filter 84 (e.g., filter circuitry and/or software) may remove undesired noise from the received signal, such as cross-channel interference. The filter 84 may also remove additional signals received by the one or more antennas 55 that are at frequencies other than the desired signal. The filter 84 may include any suitable filter or filters to remove the undesired noise or signals from the received signal, such as a bandpass filter, a bandstop filter, a low pass filter, a high pass filter, and/or a decimation filter. The low noise amplifier 82 and/or the filter 84 may be referred to as part of the RFFE, and more specifically, a receiver front end (RXFE) of the electronic device 10.

A demodulator 86 may remove a radio frequency envelope and/or extract a demodulated signal from the filtered signal for processing. An analog-to-digital converter (ADC) 88 may receive the demodulated analog signal and convert the signal to a digital signal of incoming data 90 to be further processed by the electronic device 10. Additionally, the receiver 54 may include any suitable additional components not shown, or may not include certain of the illustrated components, such that the receiver 54 may receive the received signal 80 via the one or more antennas 55. For example, the receiver 54 may include a mixer and/or a digital down converter.

Figure 5:
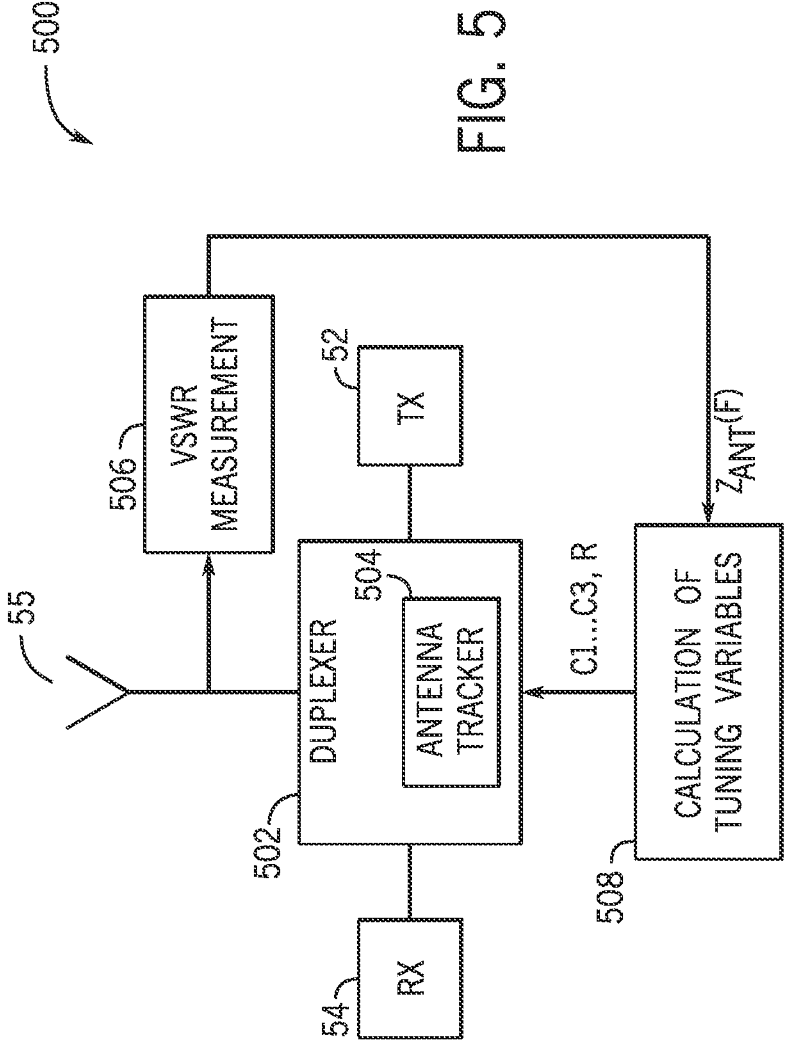
FIG. 5 is a block diagram of an analytic antenna tracking system including antenna tracking circuitry, according to embodiments of the present disclosure.

FIG. 5 is a block diagram of an analytic antenna tracking system 500, according to embodiments of the present disclosure. The analytic antenna tracking system 500 may include the antenna 55 coupled to a duplexer 502 (e.g., an electrical balanced duplexer, a phase balanced duplexer, and so on). The duplexer 502 may be coupled to the transmitter 52 and the receiver 54 and include antenna tracking circuitry 504. The duplexer 502 may use electrical balancing in hybrid junctions to isolate wireless signals between the transmitter 52 and the receiver 53. The analytic antenna tracking system 500 includes voltage standing wave ratio (VSWR) measurement circuitry 506 that may determine antenna impedance and tuning circuitry 508 that may determine tuning states of tunable components of the antenna tracking circuitry 504. The tuning circuitry 508 may receive impedance (e.g., VSWR) measurements from the VSWR measurement circuitry 506 and may receive a transmission (TX) frequency associated with a transmission signal sent from the transmitter 52 and a receiver (RX) frequency associated with a receive signal received by the receiver 54. The analytic antenna tracking system 500 may adjust the antenna tracking circuitry 504 to provide impedance matching for the antenna 55 or enhance isolation between the transmitter 52 and the receiver 54, as will be discussed in greater detail below.

Figure 6:
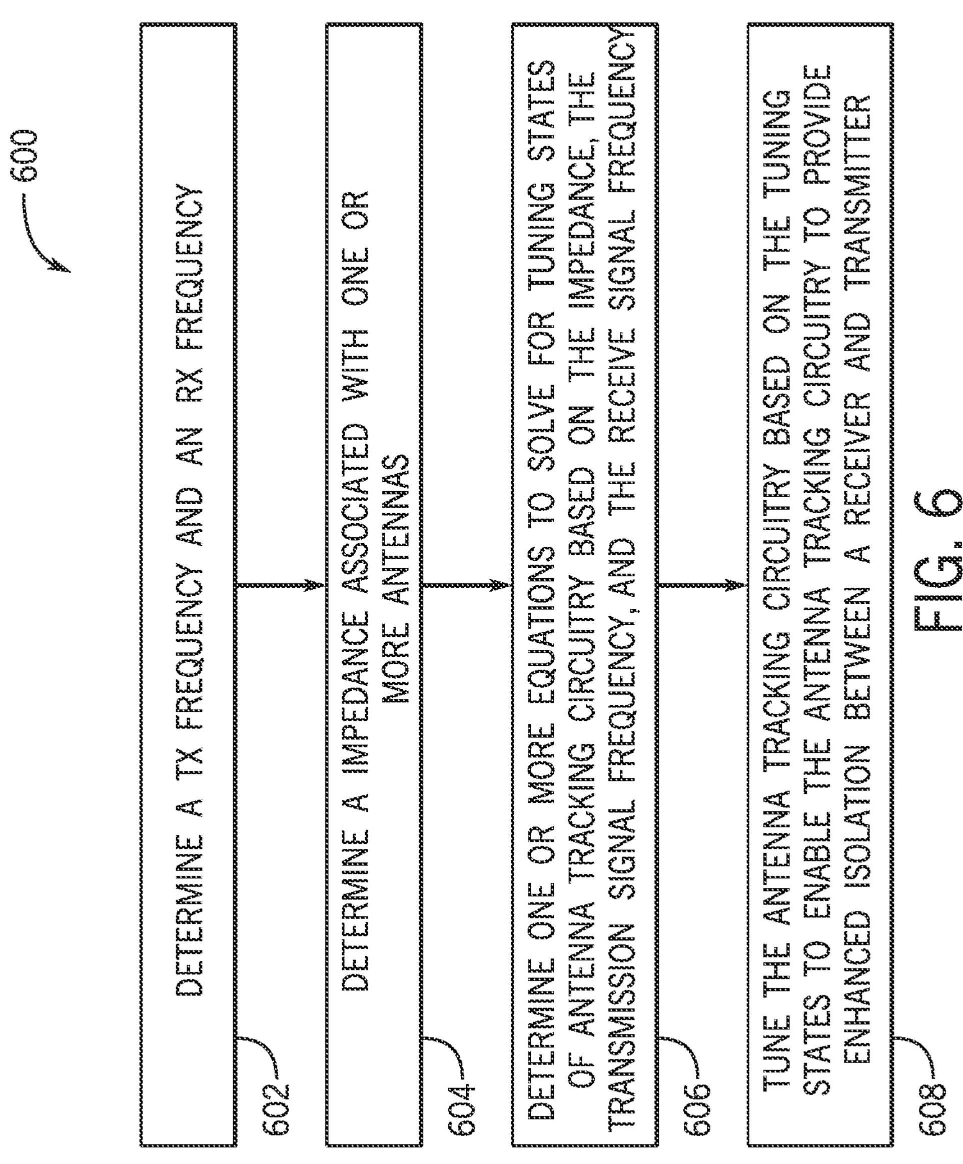
FIG. 6 is a flowchart of a method for tuning settings of the antenna tracking circuitry of FIG. 5, according to embodiments of the present disclosure.

FIG. 6 is a flowchart of a method 600 for tuning settings of the antenna tracking circuitry 504, according to embodiments of the present disclosure. Any suitable device (e.g., a controller) that may control components of the electronic device 10, such as the processor 12, may perform the method 600. In some embodiments, the method 600 may be implemented by executing instructions stored in a tangible, non-transitory, computer-readable medium, such as the memory 14 or storage 16, using the processor 12. For example, the method 600 may be performed at least in part by one or more software components, such as an operating system of the electronic device 10, one or more software applications of the electronic device 10, and the like. While the method 600 is described using steps in a specific sequence, it should be understood that the present disclosure contemplates that the described steps may be performed in different sequences than the sequence illustrated, and certain described steps may be skipped or not performed altogether.

In process block 602, the analytic antenna tracking system 500 determines (e.g., via the processor 12) the TX frequency associated with the transmission signal sent from the transmitter 52 and the RX frequency associated with the receive signal received by the receiver 54. In some embodiments, the TX frequency and RX frequency may be received from a base station, an access point, or the like. In process block 604, the antenna tracking system 500 determines (e.g., via the VSWR measurement circuitry 506) an impedance associated with the antenna 55.

As previously discussed, the tuning circuitry 508 may receive the impedance measurements from the VSWR measurement circuitry 506 and may receive the TX frequency and the RX frequency for the transmitter 52 and the receiver 54, respectively. In process block 606, the analytic antenna tracking system 500 may determine (e.g., via the tuning circuitry 508) relationships (e.g., equations) to adjust tunable components of the antenna tracking circuitry 504 based on the impedance measurements received from VSWR measurement circuitry 506, the TX frequency, and the RX frequency. As will be discussed in greater detail below, the tunable states may include values (e.g., capacitance values, resistance values) that may be tuned or adjusted to adjust one or more impedance values associated with one or more impedance devices of the antenna tracking circuitry 504. In process block 608, the analytic antenna tracking system 500 may (e.g., via the processor 12 and/or the tuning circuitry 508) tune the antenna tracking circuitry 504 based on the tuning states of the tunable components determined by solving the equations. By tuning the antenna tracking circuitry 504, the analytic antenna tracking system 500 may enable the antenna tracking circuitry 504 to provide impedance matching for the analytic antenna tracking system 500, and thus provide or improve isolation between the receiver 54 and the transmitter 52.

Figure 7:
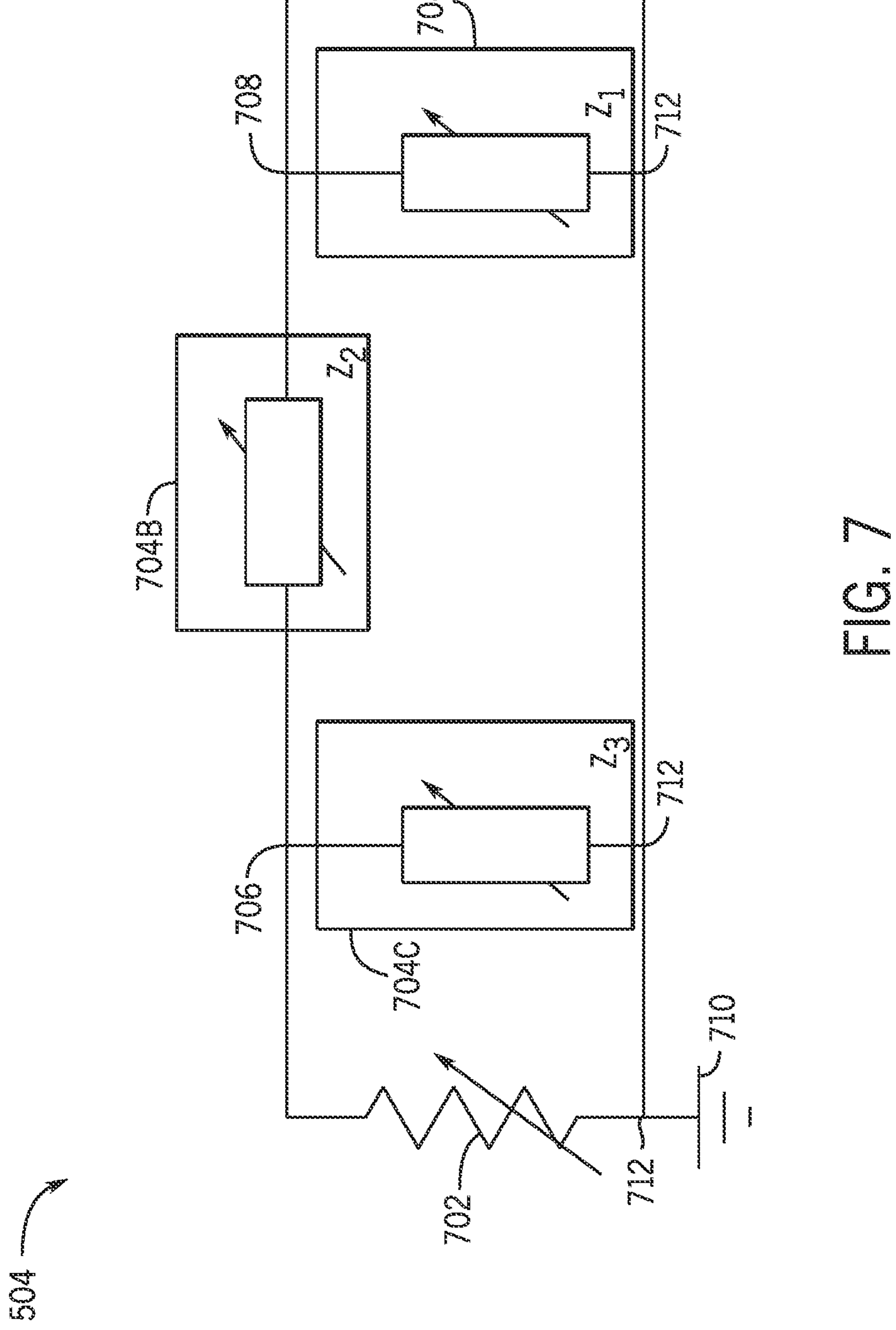
FIG. 7 is a schematic diagram of the antenna tracking circuitry of FIG. 5, according to embodiments of the present disclosure.
Figure 8:
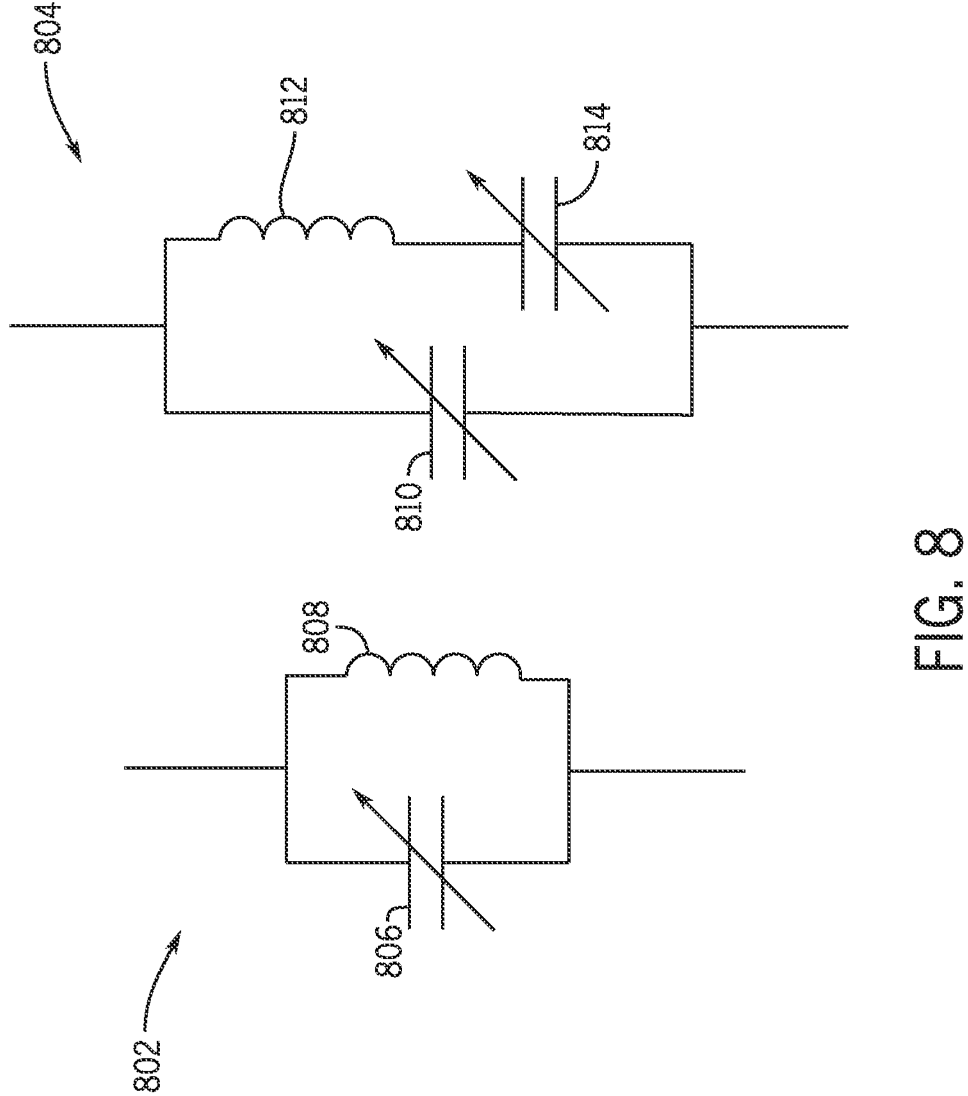
FIG. 8 includes a first circuit and a second circuit that may each be included in one or more of the impedance devices of the antenna tracking circuitry of FIG. 7, according to embodiments of the present disclosure.

FIG. 7 is a schematic diagram of the antenna tracking circuitry 504, according to embodiments of the present disclosure. The antenna tracking circuitry 504 includes a variable resistor 702 and an impedance device 704A, an impedance device 704B, and an impedance device 704C (collectively, the impedance devices 704). The variable resistor 702 is coupled in parallel to an impedance device 704C. Moreover, the impedance device 704C is coupled to the impedance device 704B, as well as the variable resistor 702, at a node 706, and the impedance device 704B is coupled to the impedance device 704A at a node 708. The variable resistor 702, the impedance device 704C, and the impedance device 704A are coupled to ground 710 at a node 712. The variable resistor 702 and the impedance devices 704 may be tunable based on relationships (e.g., equations, functions, expressions, and so on) solved by the tuning circuitry 508. The impedance devices 704 may each include an analytically solvable architecture. FIG. 8 includes a circuit 802 and a circuit 804 that may each be included in one or more of the impedance devices 704 of FIG. 7, according to embodiments of the present disclosure. The circuit 802 includes a variable capacitor 806 coupled in parallel with an inductor 808. The circuit 804 includes the variable capacitor 810 coupled in parallel to the series combination of an inductor 812 and a variable capacitor 814.

In some embodiments the circuit 802 may be included in the impedance device 704A, the impedance device 704B, and the impedance device 704C, such that all impedance devices 704 are symmetrical (e.g., have identical circuit architectures). In other embodiments, the circuit 804 may be included in the impedance device 704A, the impedance device 704B, and the impedance device 704C such that all impedance devices 704 are symmetrical (e.g., have identical circuit architectures). While in other embodiments, the impedance devices 704 may include an asymmetrical combination of circuit architectures where certain impedance devices 704 include the circuit 802 and other impedance devices 704 include the circuit 804.

Figure 9:
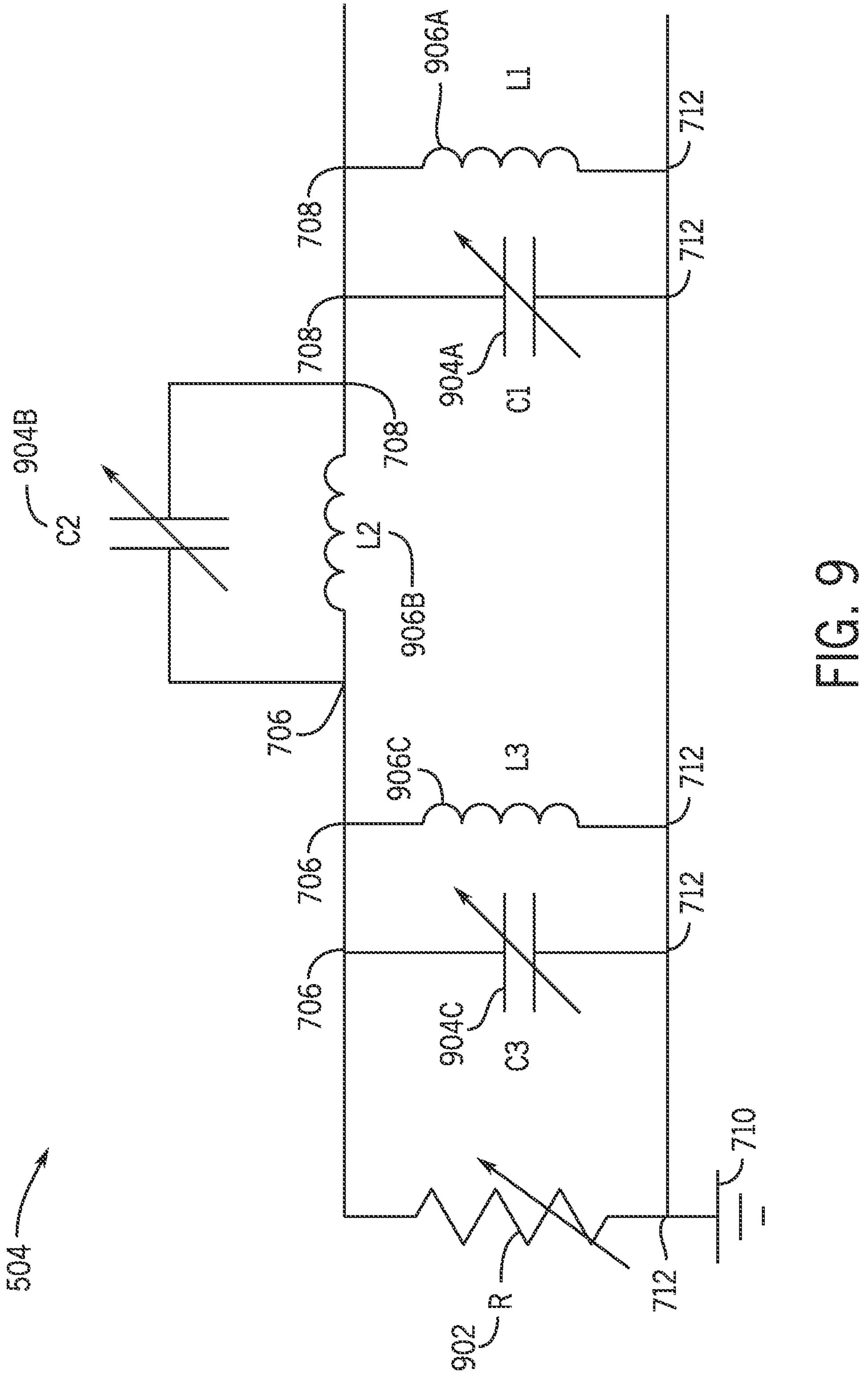
FIG. 9 is a schematic diagram of the antenna tracking circuitry including the first circuit of FIG. 8 in a symmetrical architecture, according to embodiments of the present disclosure.

FIG. 9 is a schematic diagram of antenna tracking circuitry 504 including the circuit 802 in a symmetrical architecture, according to embodiments of the present disclosure. The antenna tracking circuitry 504 includes a variable resistor 902 (e.g., ranging from 40 ohms to 300 ohms) coupled in parallel to a variable capacitor 904C (e.g., ranging from 1 picofarad (pF) to 25 pF), and also coupled in parallel to an inductor 906C (e.g., ranging from 1 nanohenry (nH) to 20 nH). The variable resistor 902, the variable capacitor 904C and the inductor 906C are coupled to an inductor 906B (e.g., ranging from 1 nanohenry (nH) to 20 nH) at node 706. The inductor 906B is also coupled in parallel to a variable capacitor 904B (e.g., ranging from 1 picofarad (pF) to 25 pF). That is, the variable resistor 902, the inductors 906C and 906B, and the variable capacitors 904C and 904B are coupled at the node 706. The variable resistor 902, the variable capacitor 904C and the inductor 906C are also coupled to the variable capacitor 904A (e.g., ranging from 1 picofarad (pF) to 25 pF) and ground 710 at node 712. The variable capacitor 904A is also coupled in parallel to an inductor 906A (e.g., ranging from 1 nanohenry (nH) to 20 nH). That is, the variable resistor 902, the inductors 906C and 906A and the variable capacitors 904C and 904A are coupled to the ground 710 at the node 712. The variable capacitor 904B and the inductor 906B are also coupled to the variable capacitor 904A and the inductor 906A at the node 708.

As will be discussed in greater detail below, the tuning circuitry 508 may, based on defined relationships or solved equations, cause the antenna tracking circuitry 504 to adjust resistance values corresponding to the variable resistor 902 and capacitance values corresponding to the variable capacitors 904A, 904B, and 904C (collectively the variable capacitors 904) to tune the antenna tracking circuitry 504 to match the impedance of the antenna 55 and thus provide or improve TX/RX isolation. It should be noted that, while FIG. 9 illustrates the antenna tracking circuitry 504 as including the circuit 802 for all impedance devices 704, in some embodiments the antenna tracking circuitry 504 may include the circuit 804 for all impedance devices 704 or may, in other embodiments, include a combination of the circuit 802 and the circuit 804 for the impedance devices 704.

Figure 10:
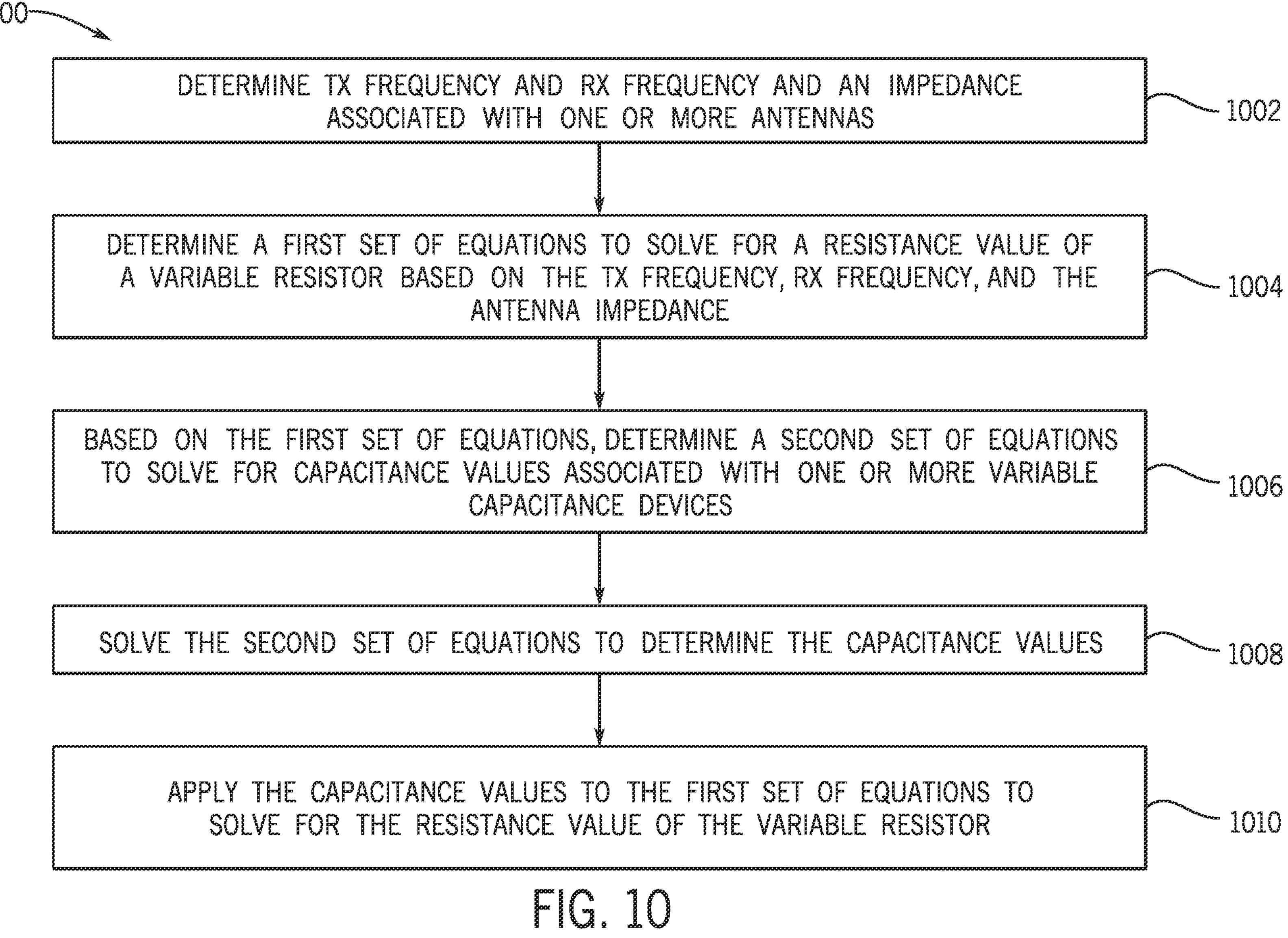
FIG. 10 is a flowchart of a method for tuning the antenna tracking circuitry to provide or improve antenna impedance matching and isolation, according to embodiments of the present disclosure.

FIG. 10 is a flowchart of a method 1000 for tuning the antenna tracking circuitry 504 to provide or improve antenna impedance matching and isolation, according to embodiments of the present disclosure. Any suitable device (e.g., a controller) that may control components of the electronic device 10, such as the processor 12, the tuning circuitry 508 and/or the antenna tracking circuitry 504, may perform the method 1000. In some embodiments, the method 1000 may be implemented by executing instructions stored in a tangible, non-transitory, computer-readable medium, such as the memory 14 or storage 16, using the processor 12. For example, the method 1000 may be performed at least in part by one or more software components, such as an operating system of the electronic device 10, one or more software applications of the electronic device 10, and the like. While the method 1000 is described using steps in a specific sequence, it should be understood that the present disclosure contemplates that the described steps may be performed in different sequences than the sequence illustrated, and certain described steps may be skipped or not performed altogether.

In process block 1002, the tuning circuitry 508 determines a TX frequency associated with a signal transmitted by the transmitter 52 and determines an RX frequency associated with a signal received by the receiver 54. In the process block 1002, the tuning circuitry 508 receives an antenna impedance associated with the antenna 55 from the VSWR measurement circuitry 506. In process block 1004, the tuning circuitry 508 determines relationships to define (e.g., Equation 1 and Equation 2 below to solve) for a resistance value of the variable resistor 902 based on the TX frequency and the RX frequency.

$$\frac{1}{R} = \frac{1}{\frac{1}{Y_{AT}(f_{TX}) - Y_{LC1}(f_{TX})} - Z_{LC2}(f_{TX})} - Y_{LC3}(f_{TX}) \qquad \text{Equation 1}$$

-continued $$\frac{1}{R} = \frac{1}{\frac{1}{Y_{AT}(f_{RX}) - Y_{LC1}(f_{RX})} - Z_{LC2}(f_{RX})} - Y_{LC3}(f_{RX}) \quad \text{Equation 2}$$

where:

$Y_{AT}$ is the admittance of the antenna 55, which may be derived by the tuning circuitry 508 from the antenna impedance received by the tuning circuitry 508 from the VSWR measurement circuitry 506;

$f_{TX}$ is the TX frequency;

$f_{RX}$ is the RX frequency;

$Y_{LC1}$ is the admittance of the parallel combination of the inductor 906A and the variable capacitor 904A;

$Z_{LC2}$ is the impedance of the parallel combination of the inductor 906B and the variable capacitor 904B; and $Y_{LC3}$ is the admittance of the parallel combination of the inductor 906C and the variable capacitor 904C.

The tuning circuitry 508 may set up Equation 1 using either the TX frequency and may set up Equation 2 using the RX frequency. Both Equation 1 and Equation 2 will provide the same resistance (or conductance) value, as resistance is constant over frequency.

In process block 1006, the tuning circuitry 508 may, based on Equation 1 and Equation 2, determine a second relationship to define (e.g., a second set of equations to solve) for capacitance values of the variable capacitors 904 that may enable the antenna tracking circuitry 504 to provide enhanced impedance matching and isolation. Using Equation 1 or Equation 2, and leveraging the fact that resistance is constant over frequency (e.g., such that the resistance value R includes only a real component and no imaginary component), the real portions of Equation 1 and Equation 2 may be set equal to each other. Equation 3 and Equation 4 below may also be derived based on the Equation 1 and Equation 2, and based on the fact that the resistance value R includes no imaginary part.

$$imag\left(\frac{1}{\frac{1}{Y_{AT}(f_{TX}) - Y_{LC1}(f_{TX})} - Z_{LC2}(f_{TX})} - Y_{LC3}(f_{TX})\right) = 0 \quad \text{Equation 3}$$

$$imag\left(\frac{1}{\frac{1}{Y_{AT}(f_{RX}) - Y_{LC1}(f_{RX})} - Z_{LC2}(f_{RX})} - Y_{LC3}(f_{RX})\right) = 0 \quad \text{Equation 4}$$

In process block 1008, the tuning circuitry 508 determines the capacitance values for the variable capacitors 904 by solving real(Equation 1)=to real (Equation 2),Equation 3, and Equation 4. In process block 1010, the tuning circuitry 508 solves Equation 1 or Equation 2 based on the capacitance values determined by solving real(Equation 1)=to real (Equation 2),Equation 3, and Equation 4 to determine R. The tuning circuitry 508 or the duplexer 502 (e.g., the antenna tracking circuitry 504 of the duplexer 502) may tune the variable resistor 902 and the variable capacitors 904 based on the tuning circuitry 508 solving Equation 1 or 2, setting a real component of Equation 1 equal to a real component of Equation 2 (e.g., real(Equation 1)=real(Equation 2)), and Equation 3 and 4, thus causing the antenna tracking circuitry 504 to match impedance with the antennas 55.

It should be noted that the method 1000 may be performed in real-time (e.g., during operational use of the electronic device 10 after, for example, a user has purchased the device 10), or during a manufacturing, testing, or quality assurance stage of the device 10. For example, the method 1000 may be performed during manufacture such that the settings provided by solving the equations are stored in the memory 14 and/or the storage 16 (e.g., in the form of a lookup table). In this manner, the method 1000 may tune the antenna tracking circuitry 504 to provide or improve antenna impedance matching and isolation.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

What is claimed is:

1. An electronic device, comprising:

a plurality of antennas;

a transmitter;

a receiver; and duplexing circuitry coupled to the transmitter, the receiver, and the plurality of antennas, the duplexing circuitry comprising a resistance device, a first impedance device coupled in parallel to the resistance device, a second impedance device coupled to the first impedance device and the resistance device at a first node, and a third impedance device coupled to the second impedance device at a second node, and coupled to the first impedance device, the resistance device, and a ground at a third node, wherein the first impedance device, the second impedance device, the third impedance device, and the resistance device are configurable to match an impedance associated with the plurality of antennas, and the first impedance device, the second impedance device, and the third impedance device each comprise at least one capacitor coupled in parallel to at least one inductor.

2. The electronic device of claim 1, wherein the first impedance device, the second impedance device, or both, comprise a first capacitor coupled in parallel to a series combination of a second capacitor and an inductor.

3. The electronic device of claim 1, comprising measurement circuitry configured to determine the impedance associated with the plurality of antennas.

4. The electronic device of claim 3, wherein the measurement circuitry comprises voltage standing wave ratio measurement circuitry.

5. The electronic device of claim 1, comprising tuning circuitry configured to determine a tuning state for the first impedance device, the second impedance device, the third impedance device, the resistance device, or any combination thereof.

6. The electronic device of claim 5, wherein the tuning circuitry is configured to determine the tuning state based on the impedance, a first frequency associated with the transmitter, and a second frequency associated with the receiver.

7. The electronic device of claim 1, wherein the first impedance device, the second impedance device, the third impedance device, and the resistance device are configurable to match the impedance associated with the plurality of antennas based on a frequency of a signal transmitted by the plurality of antennas.

8. A duplexer comprising:

a resistance device;

a first impedance device coupled in parallel to the resistance device;

a second impedance device coupled to the first impedance device and the resistance device at a first node; and a third impedance device coupled to the second impedance device at a second node, and coupled to the first impedance device, the resistance device, and a ground at a third node, wherein the first impedance device, the second impedance device, the third impedance device, and the resistance device are configurable to match an impedance associated with a plurality of antennas coupled to the duplexer based on a frequency of a signal transmitted by the plurality of antennas.

9. The duplexer of claim 8, wherein the first impedance device or the second impedance device comprises a capacitor coupled in parallel to an inductor.

10. The duplexer of claim 8, wherein the first impedance device or the second impedance device comprises a first capacitor coupled in parallel to a series combination of a second capacitor and an inductor.

11. The duplexer of claim 8, wherein the duplexer is coupled to measurement circuitry configured to determine the impedance associated with the plurality of antennas.

12. The duplexer of claim 8, wherein the duplexer is coupled to tuning circuitry configured to determine a tuning state for the first impedance device, the second impedance device, the third impedance device, or the resistance device.

13. The duplexer of claim 12, wherein the tuning circuitry is configured to determine the tuning state based on the impedance, a first frequency associated with a transmitter coupled to the duplexer, and a second frequency associated with a receiver coupled to the duplexer.

14. A transceiver comprising:

transmitting circuitry;

receiving circuitry;

duplexing circuitry coupled to the transmitting circuitry and the receiving circuitry, the duplexing circuitry comprising a resistance device, a first impedance device coupled in parallel to the resistance device, a second impedance device coupled to the first impedance device and the resistance device at a first node, and a third impedance device coupled to the second impedance device at a second node, and coupled to the first impedance device, the resistance device, and a ground at a third node; and tuning circuitry coupled to the duplexing circuitry and configured to adjust the first impedance device, the second impedance device, the third impedance device, and the resistance device to match an impedance associated with a plurality of antennas coupled to the transceiver.

15. The transceiver of claim 14, wherein the duplexing circuitry is coupled in series to voltage standing wave ratio measurement circuitry.

16. The transceiver of claim 14, wherein the duplexing circuitry is coupled in series to tuning circuitry configured to determine a tuning state for the first impedance device, the second impedance device, the third impedance device, or the resistance device.

17. The transceiver of claim 14, wherein the resistance device comprises a variable resistance device.

18. The transceiver of claim 14, wherein the first impedance device comprises at least a first capacitor, the second impedance device comprises a second capacitor and the third impedance device comprises a third capacitor.

19. The transceiver of claim 18, wherein the tuning circuitry is configured to adjust capacitance values of the first capacitor, the second capacitor, and the third capacitor based on a first frequency associated with the transmitting circuitry and a second frequency associated with the receiving circuitry.

20. The transceiver of claim 19, wherein the tuning circuitry is configured to adjust a resistance value of the resistance device based on the capacitance values.

* * * * *